United States Patent
Disney

(10) Patent No.: US 10,297,711 B2
(45) Date of Patent: May 21, 2019

(54) INTEGRATED LED AND LED DRIVER UNITS AND METHODS FOR FABRICATING THE SAME

(71) Applicant: Globalfoundries Singapore Pte. Ltd., Singapore (SG)

(72) Inventor: Donald R. Disney, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,220

(22) Filed: Dec. 30, 2015

(65) Prior Publication Data
US 2017/0194302 A1    Jul. 6, 2017

(51) Int. Cl.
| H01L 21/00 | (2006.01) |
| H01L 33/00 | (2010.01) |
| H01L 33/62 | (2010.01) |
| H01L 25/16 | (2006.01) |

(52) U.S. Cl.
CPC ...... *H01L 33/0075* (2013.01); *H01L 33/0079* (2013.01); *H01L 33/62* (2013.01); *H01L 25/167* (2013.01); *H01L 33/0095* (2013.01); *H01L 2224/023* (2013.01); *H01L 2224/0401* (2013.01); *H01L 2224/05569* (2013.01); *H01L 2224/16145* (2013.01); *H01L 2924/12041* (2013.01); *H01L 2924/1426* (2013.01); *H01L 2933/0066* (2013.01)

(58) Field of Classification Search
CPC .................................................. H01L 25/167
USPC ..................................... 257/79, 88; 438/107
See application file for complete search history.

(56) References Cited

U.S. PATENT DOCUMENTS

| 5,780,321 | A  | * | 7/1998 | Shieh ............... H01L 25/162 257/E25.03 |
| 6,590,347 | B2 | * | 7/2003 | Ohno ........................ B41J 2/45 257/88 |
| 7,776,637 | B2 |   | 8/2010 | Leem |
| 8,273,588 | B2 | * | 9/2012 | Hahn ............... H01L 25/167 257/89 |
| 8,900,893 | B2 |   | 12/2014 | Wang |
| 2008/0296589 | A1 | * | 12/2008 | Speier ............... H01L 33/642 257/82 |
| 2010/0110157 | A1 | * | 5/2010 | Yonehara ................ B41J 2/45 347/130 |

(Continued)

OTHER PUBLICATIONS

Lumileds, Luxeon FlipChip, Chip-scale Packages for Maximum Design Flexibility, Mar. 31, 2015, 2 pages.

(Continued)

*Primary Examiner* — Thuy V Tran
(74) *Attorney, Agent, or Firm* — Lorenz & Kopf, LLP

(57) ABSTRACT

Integrated LED and LED driver units and methods for fabricating integrated LED and LED driver units and products with a plurality of integrated LED and LED driver units are provided. In an embodiment, a method for fabricating an integrated LED and LED driver includes forming an LED driver in a first substrate, wherein the first substrate is a semiconductor substrate. The method include forming a bond pad over a top surface of the semiconductor substrate and electrically connected to the LED driver. Also, the method includes forming an LED on a second substrate. Further, the method includes directly coupling the LED to the bond pad.

9 Claims, 5 Drawing Sheets

(56) References Cited

U.S. PATENT DOCUMENTS

| | | | |
|---|---|---|---|
| 2010/0203662 A1* | 8/2010 | Pan | H01L 33/24 438/29 |
| 2014/0186979 A1* | 7/2014 | Tu | H01L 33/52 438/27 |
| 2015/0076528 A1* | 3/2015 | Chan | H01L 27/156 257/88 |
| 2016/0149084 A1* | 5/2016 | Sudhiranjan | H01L 33/007 257/98 |

OTHER PUBLICATIONS

LED Packaging, A Comprehensive Survey of LED Packaging Covering Main Technologies and Market Metrics, Yole Development, 2012, 21 pages.

FC Led Introduction, The Next Generation in Lighing, Grand V. Development Co., Ltd., 2014, 14 pages.

Tuo, David, Trend of Sapphire Substrate Technology and Market Overview, Semi, Mar. 20, 2013, 31 pages.

* cited by examiner

INTEGRATED LED AND LED DRIVER UNITS AND METHODS FOR FABRICATING THE SAME

TECHNICAL FIELD

The technical field generally relates to light emitting diodes (LEDs), and more particularly relates to LEDs and their electrical connection to LED driver devices.

BACKGROUND

The light-emitting diode (LED) is a common lighting appliance in increasing use. In comparison with traditional incandescent light bulbs, LEDs have higher luminous efficiency and power-saving features. However, LEDs are conductive only in a single direction and thus require specialized LED driver circuits.

Typically, LEDs are formed and packaged separately from their LED driver electronics. One method for packaging LEDs and LED drivers together in a single package would connect the LED driver to an LED by a through silicon via (TSV) that passes through a silicon interposer. However, the use of silicon interposers may increase package costs. For example, package costs for LEDs could be higher than the cost of the semiconductor LED.

Accordingly, it is desirable to provide simpler and more efficient LED and CMOS compatible integration schemes and enabling methodology. Also, it is desirable to provide improved methods for fabricating LEDs and LED drivers. It is desirable to provide integrated LED and LED driver units and methods for fabricating integrated LED and LED driver units that reduce packaging costs and provide improved performance. Furthermore, other desirable features and characteristics will become apparent from the subsequent detailed description and the appended claims, taken in conjunction with the accompanying drawings and this background.

BRIEF SUMMARY

Integrated LED and LED driver units and methods for fabricating integrated LED and LED driver units and products with a plurality of integrated LED and LED driver units are provided. In an embodiment, a method for fabricating an integrated LED and LED driver includes forming an LED driver in a first substrate, wherein the first substrate is a semiconductor substrate. The method include forming a bond pad over a top surface of the semiconductor substrate and electrically connected to the LED driver. Also, the method includes forming an LED on a second substrate. Further, the method includes directly coupling the LED to the bond pad.

In another exemplary embodiment, a method for fabricating a product with a plurality of integrated LED and LED driver units is provided. The method includes forming LED drivers in a first substrate, the first substrate being a semiconductor substrate. The method forms bond pads over the semiconductor substrate, wherein each bond pad is electrically connected to a respective LED driver. Also, the method forms LEDs on a second substrate. The method includes attaching each LED to a respective bond pad to form the product with the plurality of integrated LED and LED driver units.

In yet another exemplary embodiment, an integrated LED and LED driver unit is provided. The integrated LED and LED driver unit includes a semiconductor substrate and an integrated circuit (IC) including an LED driver in the semiconductor substrate and a first bond pad over the semiconductor substrate. The first bond pad is electrically connected to the LED driver. The integrated LED and LED driver unit further includes an LED having a first electrode in electrical contact with the first bond pad of the IC. The LED is directly coupled to the first bond pad and the LED driver is configured to control a current flowing through the LED.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated LED and LED driver units or the methods for fabricating the integrated LED and LED driver units. Furthermore, there is no intention to be bound by any expressed or implied theory presented in the preceding technical field, background or brief summary, or in the following detailed description.

For the sake of brevity, conventional techniques related to integrated circuit (IC) device and LED fabrication may not be described in detail herein. Moreover, the various tasks and processes described herein may be incorporated into a more comprehensive procedure or process having additional steps or functionality not described in detail herein. In particular, various steps in the fabrication of integrated circuits are well-known and so, in the interest of brevity, many conventional steps will only be mentioned briefly herein or will be omitted entirely without providing the well-known process details.

As used herein, it will be understood that when an element or layer is referred to as being "over" another element or layer, it may be directly on the other element or layer, or intervening elements or layers may be present. When an element or layer is referred to as being "on" another element or layer, it is directly on and in contact with the other element or layer. Further, spatially relative terms, such as "above", "lower", "upper", "top" and the like, may be used herein for ease of description to describe one feature's relationship to another feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or an orientation of below. The device may be otherwise oriented (rotated 90 degrees or at other orientations) and the spatially relative descriptors used herein may likewise be interpreted accordingly.

In accordance with the various embodiments herein, integrated LED and LED driver units and methods for fabricating integrated LED and LED driver units are provided. The methods described herein provide for the formation and packaging of LEDs and the associated LED drivers together. As a result, packaging costs can be greatly reduced. Further, the methods described herein avoid use of silicon interposers and through silicon vias (TSVs) in silicon interposers. The Figures illustrate exemplary embodiments for integrated LED and LED driver units and for fabricating integrated LED and LED driver units.

Figure 1:
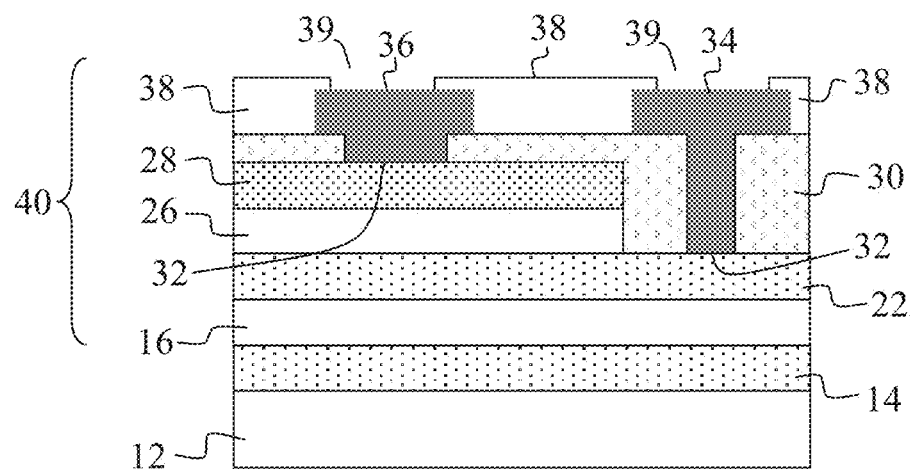
FIGS. 1-4 are cross-sectional views illustrating a process for forming LEDs according to an exemplary embodiment.

FIGS. 1-4 are cross-sectional views illustrating a process for forming LEDs according to an exemplary embodiment. In FIG. 1, a detachable substrate 12 is provided. An exemplary detachable substrate 12 is a sapphire wafer. The substrate 12 may alternatively be a silicon substrate, a ZnO substrate, a nitride semiconductor substrate, or a substrate of another suitable material. The detachable substrate 12 may include a laminated layer, such as a laminated layer including GaN, InGaN, AlGaN and/or AlInGaN.

As shown in FIG. 1, a separation layer 14, such as a laser lift-off (LLO) layer 14, is formed over the substrate 12. An exemplary separation layer 14 is removable by laser beam irradiation. An exemplary separation layer 14 is formed of at least one material selected from the group consisting of GaN, InGaN, AlGaN, AlInGaN, or a combination thereof. Also, an optional semiconductor film 16 may be formed over the separation layer 14. An exemplary semiconductor film 16 is an undoped GaN layer. Further, an exemplary semiconductor film 16 is transparent. In some embodiments, the separation layer 14 may be formed on or with the semiconductor film 16 before being applied to the detachable substrate 12.

In FIG. 1, a first layer 22 with a first polarity, an active layer 26, and a second layer 28 with a second polarity opposite to the first polarity are formed over the semiconductor film 16. An exemplary first layer 22 has an N polarity, such as an N—GaN layer 22. An exemplary active layer 26 is formed of $In_xGa_{1-x}N$ or the like. An exemplary second layer 28 has a P polarity, such as a P—GaN layer 28. In an exemplary embodiment, the first layer 22, active layer 26 and second layer 28 are laminated over the substrate 12 using a metal organic chemical vapor deposition (MOCVD) process. Heat treatment may be carried out to activate impurities of the P—GaN layer 28

Portions of P—GaN layer 28 and active layer 26 are removed to expose a top surface of N—GaN layer 22. A dielectric layer 30 is deposited over the exposed surfaces and subsequently patterned (partially removed) to expose contact openings 32 to GaN layers 28 and 22. Dielectric layer 30 may be formed of silicon dioxide, silicon nitride, or the like. One or more metallization layers are formed and patterned to create anode 34 and cathode 36, which may include multiple metal layers. For example, to provide good electrical contact to P—GaN layers 28, the contact metal may be palladium, platinum, nickel, and the like. To provide good electrical contact to N—GaN layers 22, the contact metal may be titanium, aluminum, and the like. Additional metal layers may be laminated on top of the contact metal layers to provide a metal surface that is suitable for integration as discussed below. For example, a solderable metal stack such as titanium, nickel, and gold or silver may be laminated on top of the contact metal layers to provide a solderable metal surface.

A passivation layer 38 may be formed over dielectric layer 30 and over portions of anode 34 and cathode 36. Passivation layer 38 may be a dielectric material such as silicon dioxide, silicon nitride, polyimide, and the like. Openings 39 are formed in passivation layer 38 to allow for electrical contact to anode 34 and cathode 36.

As a result of the process shown in FIG. 1, a light emitting structure 40 is fabricated over the separation layer 14 and substrate 12. The light emitting structure 40 includes the semiconductor film 16, first layer 22, active layer 26 and second layer 28. The light emitting structure 40 may be processed further to form one light emitting diode (LED) or a plurality of light emitting diodes (LEDs) on a wafer basis.

Figure 2:
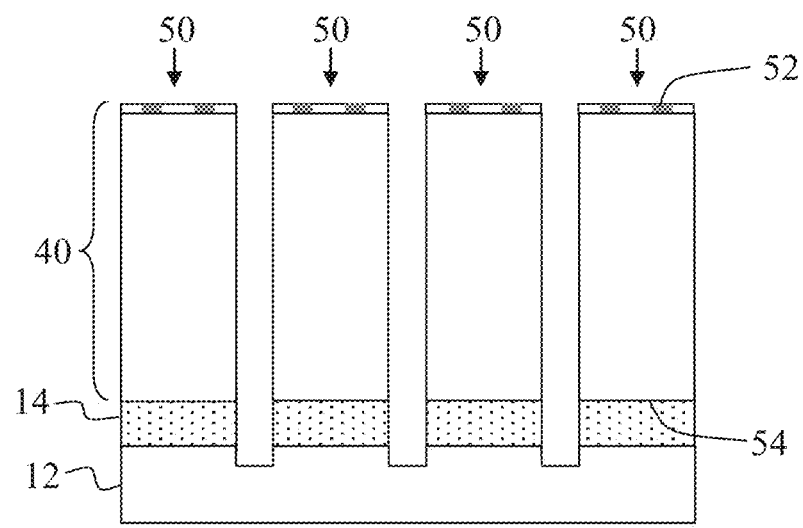

While FIG. 1 illustrates the formation of a single anode 34 and cathode 36 pair, the method may form a plurality of pairs of anodes 34 and cathodes 36 arranged side by side in the light emitting structure 40 over the substrate 12. In FIG. 2, a cutting process is performed to separate the light emitting structure 40 into separate light emitting diodes 50. While not shown, each light emitting diode 50 in FIG. 2 may include semiconductor film 16, first layer 22, active layer 26, second layer 28, dielectric layer 30, an anode 34, a cathode 36, and passivation layer 38.

In an exemplary embodiment, a dicing process (e.g. laser dicing, dicing with a diamond stylus, or dicing by sawing) is performed to separate the light emitting structure 40 into separate light emitting diodes (LEDs) 50. As shown, an exemplary dicing process separates the light emitting structure 40 into LEDs 50 while the substrate 12 remains at least partially uncut. The separation layer 14 may be cut by the dicing process. Each LED 50 has an upper surface 52 and a lower surface 54. As shown, the lower surface 54 of each LED 50 is in contact with the separation layer 14.

Figure 3:
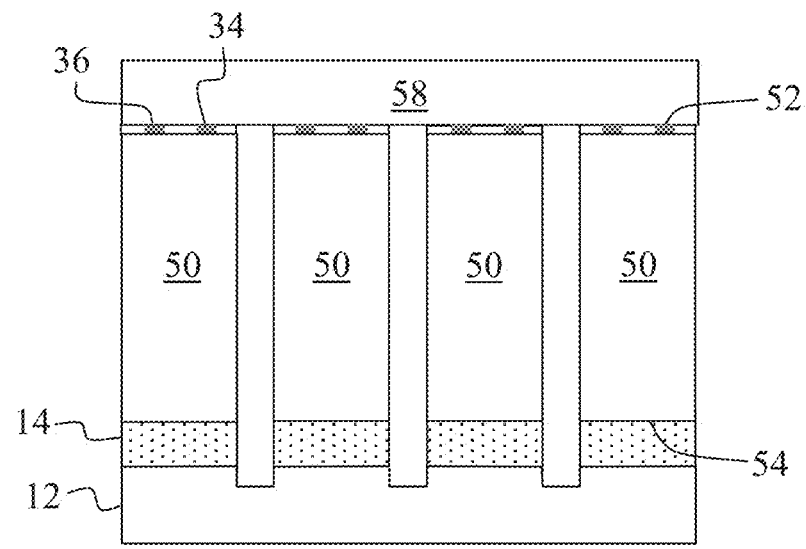

In FIG. 3, a carrier 58 is bonded to the LEDs 50. Specifically, the carrier 58 is bonded to the upper surface 52 of each LED 50. An exemplary carrier 58 is tape (such as conventional organic dicing tape, a.k.a. "blue tape"), a silicon wafer, a sapphire wafer, or another suitable substrate. The LEDs 50 are lightly adhered to the carrier 58 such that the LEDs 50 may be removed from the carrier 58 without damaging LEDs 50 (e.g. by grasping and pulling, such as by conventional pick and place equipment). For example, an LED 50 could be removed from conventional dicing tape by photo-processing.

Figure 4:
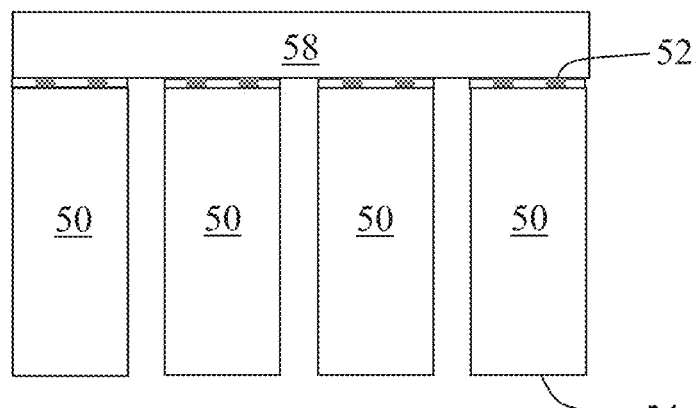

In FIG. 4, a laser beam is irradiated on the separation layer 14 through the substrate 12 to remove the separation layer 14. For example, an exemplary separation layer 14 is provided to absorb a laser passing through the detachable substrate 12 and has a controlled composition ratio of Ga, In, Al and the like so as to have an energy band gap larger than that of the substrate 12 and smaller than that of the active layer 26. When the laser passes through the substrate 12 and is absorbed by the separation layer 14, the components of the separation layer 14, i.e., (Al) (In) GaN and the like, can be divided into Ga, $N_2$ and the like, thereby causing the detachment of the substrate 12 from the remaining structure. As a result, the substrate 12 is detached from the LEDs 50.

The structure illustrated in FIG. 4 provides the LEDs 50 for individual selection and removal from the carrier 58 as described below.

In an alternative embodiment, the separation of substrate 12 from light emitting structure 40 may be performed before light emitting structure 40 is diced into individual LEDs 50.

Figure 5:
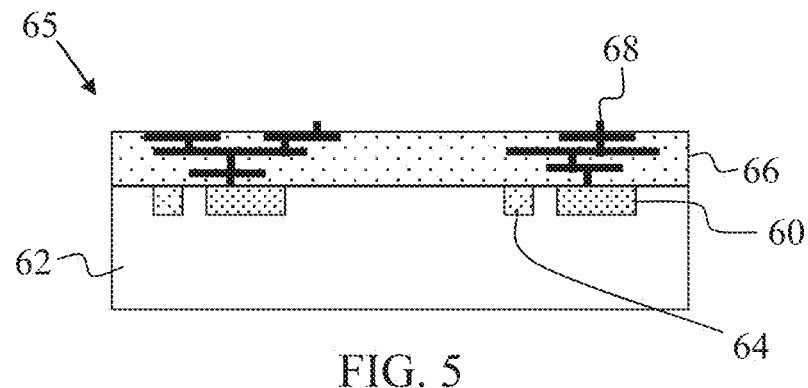
FIGS. 5-6 are cross-sectional views illustrating a process for forming LED driver devices and electrical connection structures according to an exemplary embodiment.
Figure 6:
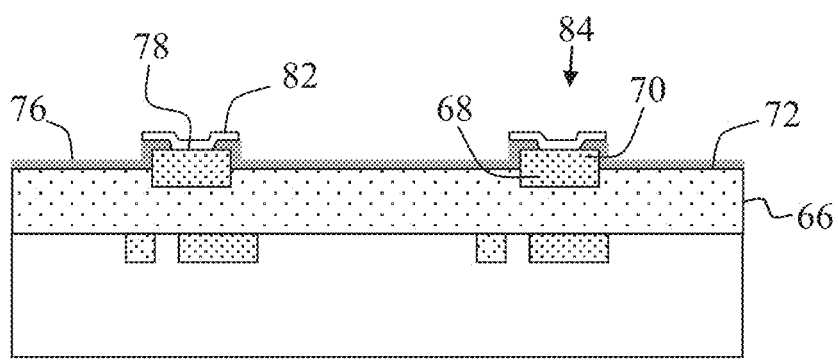

FIGS. 1-4 illustrate a process for forming LEDs 50 according to an exemplary embodiment. In FIGS. 5-6, a process is illustrated for forming LED driver devices 60 and interconnection structures thereto according to an exemplary embodiment.

As shown in FIG. 5, a semiconductor substrate 62 in and/or on which semiconductor devices are fabricated is provided. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 10 weight percent based on the total weight of the material unless otherwise indicated.

LED driver devices 60, such as metal oxide field effect transistors (MOSFETs), are formed in the semiconductor substrate 12 according to conventional IC processing. Also, sensor devices 64, such as thermal or optical sensors formed from IC device elements, such as MOSFETs, resistors, or diodes, may be formed in the semiconductor substrate 62 according to conventional IC processing. A plurality of LED driver devices 60 and sensor devices 64 may be located in an IC 65. The semiconductor substrate 12 may include a plurality of ICs 65. In an exemplary embodiment, various metal and dielectric layer deposition and etching processes may be performed according to conventional IC processing to form a dielectric 66 with an embedded metallization structure 68 in selective contact with devices 60 and 64.

FIG. 6 provides an enhanced view of the upper portion of the structure of FIG. 5 while the remaining structure of the metallization structure 68 is not shown for reasons of clarity. In FIG. 6, the metallization structure 68 is shown to include final metal pads or bond pads 70 as an uppermost layer. Exemplary final metal pads 70 are copper, aluminum, or another suitable conductive material. The final metal pads 70 may extend above the upper surface 72 of the interlayer dielectric 66.

In FIG. 6, a passivation layer 76 is deposited over the final metal pads 70 and the upper surface 72 of the interlayer dielectric 66. An exemplary passivation layer 76 is one or more dielectric materials such as silicon dioxide, silicon nitride, polyimide, or the like. In an exemplary embodiment, the passivation layer 76 is deposited by plasma enhanced chemical vapor deposition (PECVD) or similar suitable process. As shown, a portion of the passivation layer 76 is removed from the final metal pads 70 to provide exposed surfaces 78 of the final metal pads 70. For example, a conventional lithography process and reactive ion etching (RIE) process may be performed to selectively remove the portions of the passivation layer 76 overlying the final metal pads 70.

The method may continue with forming an under bump metallization (UBM) layer 82 over the final metal pads 70 and in contact with the exposed surfaces 78 of the final metal pads 70. An exemplary UBM layer 82 is formed of a laminated structure such as Ti/Pt/Au, Ti/Au, Ni/Au or Pt/Au or similar suitable metallization stacks. The UBM layer 82 may be formed by physical vapor deposition (PVD), evaporation, or other suitable processes. Attributes of the UBM layer for consideration include good mechanical adhesion to the final metal pads 70, a top surface that is compatible with the die attach process (discussed below), and good electrical contact between the die attach materials and the final metal pads 70.

As a result of the processing of FIGS. 5-6, an interconnection structure 84 is formed from the metal pads 70 and UBM layer 82 overlying the LED driver devices 60 and devices 64. The interconnection structure 84 is in selective electrical contact with LED driver devices 60 and sensor devices 64.

Figure 7:
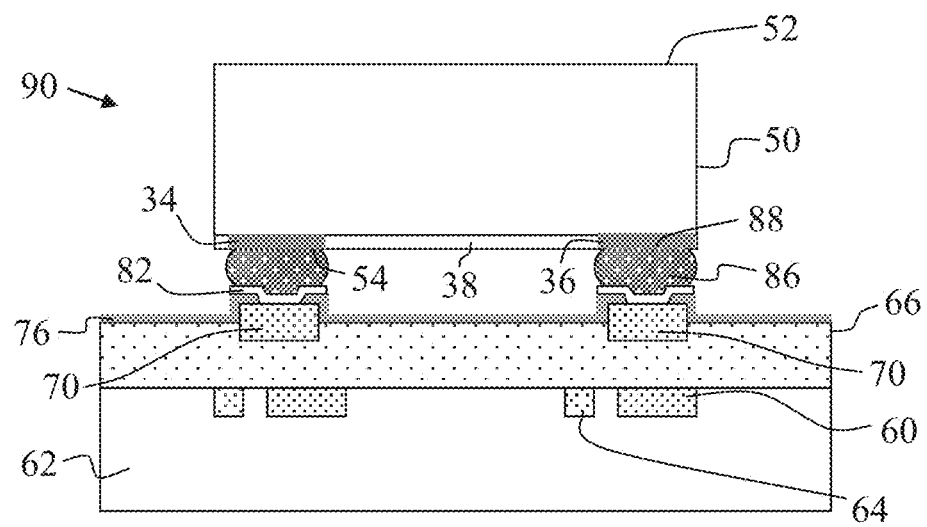
FIG. 7 is a cross-sectional view illustrating a process for connecting an LED to a LED driver device to form an integrated LED and LED driver unit according to an exemplary embodiment.

The method continues in FIG. 7 with the connection of a selected LED 50 from FIG. 4 to the LED driver device 60 through the interconnection structure 84 of FIG. 6. Specifically, a die attach region 86 is positioned on each UBM layer 82, and the surface 54 of the LED 50 is contacted to each die attach region 86. An exemplary die attach region 86 may include a solder bump, conductive epoxy or another suitable conductive and malleable material that may harden and adhere to provide a mechanical and electrical connection between LED 50 and IC 65. The die attach region 86 is deformable and forms a substantially planar upper surface 88 in contact with the anode 34 and cathode 36 of LED 50. Further, the die attach region 86 adheres to the UBM layer 82 and to the LED 50 to bond the LED 50 and the LED driver 60 together to form an integrated LED and LED driver unit 90. In an exemplary embodiment, the anode 34 and cathode 36 of LED 50, the die attach region 86, and/or the metal pads 70 may include reflective materials such as Al, Ag, Pt, Au, Ni, Ti, ATO (SnO$_2$ doped with Sb), and ITO, or combinations of materials. Including one or more reflective materials below the LED 50 may provide increased light output from the upper surface 52 of the LED 50.

As fabricated in FIG. 7, the LED driver 60 is configured to control a current flowing through the LED 50. Specifically, the LED driver 60 may control a current flowing through the LED driver 60, bond pad 70, anode 34, LED 50, cathode 36, and bond pad 70.

Figure 8:
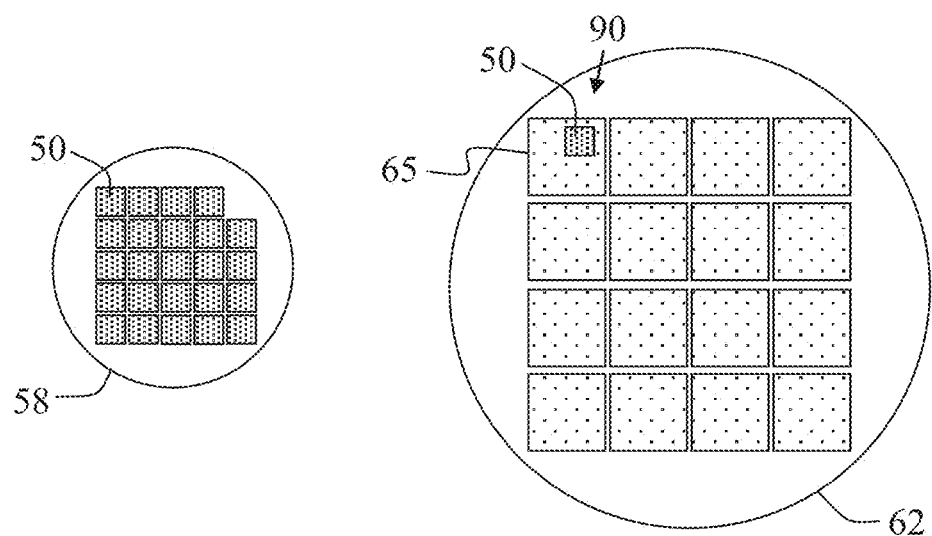
FIG. 8 is an overhead schematic view of the LED of FIG. 4 and the LED driver device of FIG. 6 during formation of an integrated LED and LED driver unit according to FIG. 7.

FIG. 8 illustrates the method of forming a plurality of integrated LED and LED driver units 90. As shown, carrier 58 includes a plurality of LEDs 50 formed from the cutting of the light emitting structure 40. Further, the substrate 62 includes a plurality of ICs 65 including LED driver devices 60 and optional sensor devices 64 (not expressly identified in FIG. 8). As shown, a selected LED 50 is removed from the carrier 58, such as by conventional pick-and-place equipment, for connection to a selected IC 65. Die attach regions 86, such as solder bumps or epoxy bumps, are positioned on the UBM layer 82 (not shown) of the selected IC 65 on substrate 62. Alternatively, the die attach regions 86 may be positioned on the selected LED 50. In either case, the LED 50 is then aligned with and contacted to the interconnection structure (not shown) over the selected IC 65. As a result, an electrical and mechanical connection is formed between devices of the IC 65 and the LED 50. Each connected pair of LED and LED drivers forms an integrated LED and LED driver unit 90. A unit 90 may include an LED in connection with a plurality of LED drivers and/or other devices.

Further, each of the plurality of LEDs 50 may be contacted to a respective IC 65 of the plurality of ICs 65 on substrate 62 to form a plurality of integrated LED and LED driver units 90 over substrate 62. An optional passivation layer may be formed over substrate 62, which includes LEDs 50 and ICs 65. The passivation layer may be a dielectric material that is substantially conformal with the underlying ICs and LEDs and may provide mechanical protection (e.g. scratch resistance) and protection against ingress of moisture and/or mobile ions. Contact windows may be formed in selected areas of the passivation layer to allow further packaging, as described below.

Figure 9:
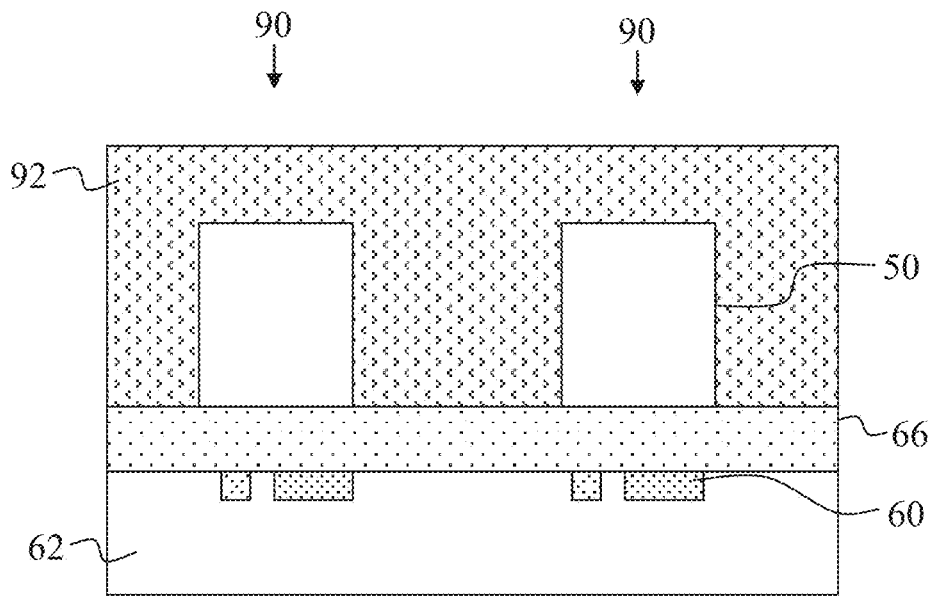
FIGS. 9-10 are cross-sectional views illustrating further processing of the integrated LED and LED driver units according to an exemplary embodiment.
Figure 10:
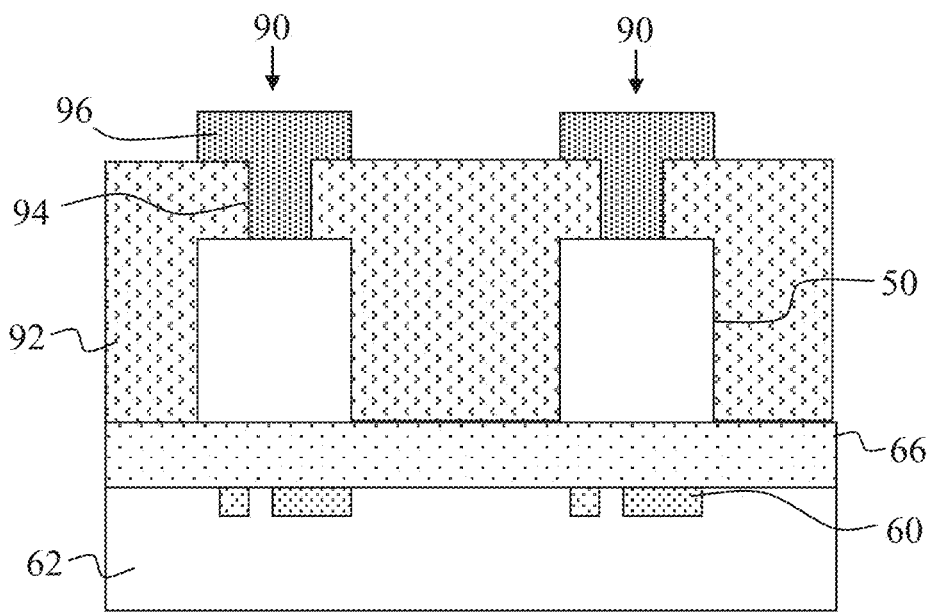

FIGS. 9-10 illustrate additional, optional processing of the integrated LED and LED driver units 90. FIGS. 9-10 provide simplified drawings for purposes of clarity, though the illustrated structures are considered to include the elements expressly shown in FIGS. 1-8. In FIG. 9, a dielectric material 92 is deposited over the LEDs 50. The top surface of dielectric material 92 is substantially planar. An exemplary dielectric material 92 is a benzocyclobutene (BCB) material, which may be deposited using spin-on process to form a relatively planar top surface and a thickness that is sufficient to insulate the underlying devices from each other.

In FIG. 10, vias 94 are etched into the dielectric material 92 to expose a portion of a respective LED 50 and/or IC 65. Then a contact material 96 is deposited in the vias 94 to form additional contacts to the LEDs 50 and/or ICs 65. An exemplary contact material 96 is titanium, titanium nitride, tungsten, copper, aluminum, or another suitable conductive material. During this processing, electrical connections may be formed to further interconnect the LEDs 50 to the underlying devices or other devices on the substrate 62. Contact material 96 may be selectively removed using conventional photolithography and etching processes to form conducting regions. Some conducting regions may serve as wires to electrically couple various elements of the LEDs and ICs. Large-area conducting regions of material 96 may serve as bond pads to provide for further packaging of the units 90.

After the process of contacting selected LEDs 50 to selected ICs 65 is completed, a dicing process may be performed on the substrate 62 including the plurality of integrated LED and LED driver units 90 to singulate the integrated LED and LED driver units 90 from one another to form individual units. These individual units may then be mounted directly onto a printed circuit board (PCB) or placed into a package, using conventional packaging techniques.

The methods described herein may provide for the integration of multiple LEDs with a single IC, and that IC may contain a plurality of LED drivers. For example, an integrated LED and LED driver unit may include hundreds of LEDs and a single IC to form a micro display.

According to embodiments herein, the semiconductor substrate provides structural support to the LEDs such that the LEDs have sufficient mechanical integrity even after they are lifted off of their native substrate. Thus the combined units 90 are free-standing units that can be further packaged or mounted directly onto a PCB.

The embodiments herein provide units having an LED stacked directly on top of an IC that includes an LED driver. As a result, the units are provided with a smaller form factor as compared to conventional LED systems, which utilize separate packaging of the LED and the driver IC. In addition to reducing the form factor, direct stacking of the LED and driver IC may greatly reduce the overall system costs, by reducing the number of packages from two to one. Moreover, the direct connection of LED and driver IC is accomplished without using an interposer (i.e. another silicon substrate that is used to provide mechanical support and electrical interconnection of both the LED and driver IC).

In an embodiment, only the active portion of the LEDs is packaged on top of the LED driver IC. The active portion of the LEDs, i.e., layers 16, 22, 26, 28 and 38, has a total thickness of less than ten microns, such as about 4 microns. This is much thinner than the semiconductor substrate of the driver IC, which may be on the order of 100 microns or more, Thus, the stacking of the LED adds less than 10% to the height of the driver IC, and does not substantially inhibit the ability to singulate the units nor to package the units using conventional techniques.

In an exemplary embodiment, the methods described herein reduce processing costs as compared to conventional techniques, such as by reducing the number of packages and avoiding use of silicon interposers and TSVs on silicon interposers. Further, the detachable substrates used to form the LEDs 50 are reusable for the formation of additional LEDs, further reducing processing costs.

Also, the devices fabricated by the methods herein provide for packaged LEDs and LED drivers and other devices in close proximity, allowing for advanced control functions. Specifically, due to the reduced distance between LEDs and LED drivers provided herein, sensing of the LEDs may be performed by sensing devices in the device area housing the LED driver. For example, a thermal sensor may be included in the IC in close proximity to the attached LED, enabling real-time sensing and control of the LED temperature. In addition, the LED and LED driver units may exhibit reduced parasitic capacitance, resistance, and inductance as compared to conventional connections between LEDs and LED drivers, which may provide advantages such as increased switching speed and reduced parasitic power loss.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated LED and LED driver, the method comprising:
   forming a first LED driver and a second LED driver on a semiconductor substrate;
   forming a first sensor on the semiconductor substrate adjacent the first LED driver and a second sensor on the semiconductor substrate adjacent the second LED driver, wherein the first sensor is a first thermal sensor and the second sensor is a second thermal sensor or wherein the first sensor is a first optical sensor and the second sensor is a second optical sensor;

forming a first bond pad and a second bond pad over the semiconductor substrate and electrically connected to the first LED driver and the second LED driver, respectively, wherein forming the first bond pad and the second bond pad over the semiconductor substrate comprises electrically connecting the first bond pad to the first sensor and electrically connecting the second bond pad to the second sensor;

forming a lower surface of a first LED and a second LED over a detachable substrate;

attaching a carrier to an upper surface of each LED;

removing the first LED from the detachable substrate;

directly coupling the lower surface of the first LED to the first bond pad to electrically connect the first LED to the first LED driver to form a first integrated unit;

removing the second LED from the detachable substrate;

directly coupling the lower surface of the second LED to the second bond pad to electrically connect the second LED to the second LED driver to form a second integrated unit;

removing the carrier from the upper surface of each LED;

depositing a dielectric material over the upper surface of each LED and over the semiconductor substrate;

etching vias into the dielectric material to expose at least a portion of the upper surface of the first LED and at least a portion of the upper surface of the second LED; and forming a first electrical interconnect in contact with the upper surface of the first LED and a second electrical interconnect in contact with the upper surface of the second LED.

2. The method of claim 1 further comprising dicing the semiconductor substrate and the dielectric material to separate the first integrated unit from the second integrated unit.

3. The method of claim 2 further comprising mounting the first integrated unit directly to a printed circuit board.

4. The method of claim 1 wherein depositing the dielectric material over the upper surface of each LED and over the semiconductor substrate comprises depositing benzocyclobutane (BCB) material over the upper surface of each LED and over the semiconductor substrate.

5. The method of claim 1 wherein forming the first bond pad and the second bond pad over the semiconductor substrate and electrically connected to the first LED driver and the second LED driver, respectively comprises forming a reflective first bond pad and a reflective second bond pad.

6. The method of claim 1 wherein the first sensor is a first thermal sensor and the second sensor is a second thermal sensor.

7. The method of claim 1 wherein the first sensor is a first optical sensor and the second sensor is a second optical sensor.

8. A method for fabricating an integrated LED and LED driver, the method comprising:

forming a first LED driver and a second LED driver on a semiconductor substrate;

forming a first bond pad and a second bond pad over the semiconductor substrate and electrically connected to the first LED driver and the second LED driver, respectively;

forming a lower surface of a first LED and a second LED over a detachable substrate;

attaching a carrier to an upper surface of each LED;

removing the first LED from the detachable substrate;

directly coupling the lower surface of the first LED to the first bond pad to electrically connect the first LED to the first LED driver to form a first integrated unit;

removing the second LED from the detachable substrate;

directly coupling the lower surface of the second LED to the second bond pad to electrically connect the second LED to the second LED driver to form a second integrated unit;

removing the carrier from the upper surface of each LED;

depositing a dielectric material over the upper surface of each LED and over the semiconductor substrate;

etching vias into the dielectric material to expose at least a portion of the upper surface of the first LED and at least a portion of the upper surface of the second LED; and forming a first electrical interconnect in contact with the upper surface of the first LED and a second electrical interconnect in contact with the upper surface of the second LED, wherein forming the lower surface of the first LED and the second LED over the detachable substrate comprises:

providing a sapphire wafer as the detachable substrate;

forming a laser lift-off layer over the sapphire wafer;

forming a transparent film over the laser-lift off layer;

forming a first layer with a first polarity over the transparent film, wherein the first layer includes the lower surface of the first LED and the second LED;

forming an active layer over the first layer;

forming a second layer with a second polarity over the active layer;

laminating the first layer, the active layer, and the second layer using a metal organic chemical vapor deposition (MOCVD) process;

removing portions of the second layer and the active layer to expose portions of the first layer;

forming a dielectric layer over the second layer and over the portions of the first layer;

patterning the dielectric layer to form contact openings exposing surfaces of the first layer and the second layer;

depositing conductive material in the contact openings to form anodes and cathodes;

forming a passivation layer over the dielectric layer and over portions of the anodes and cathodes; and cutting the passivation layer, the dielectric layer, the second layer, the active layer, the first layer, the transparent film, the laser lift-of layer and a portion of the sapphire wafer to disconnect the first LED from the second LED.

9. The method of claim 8 further comprising performing a laser separation process to separate the first LED and the second LED from the laser lift-off layer after cutting the passivation layer, the dielectric layer, the second layer, the active layer, the first layer, the transparent film, the laser lift-of layer and the portion of the sapphire wafer to disconnect the first LED from the second LED.

* * * * *